United States Patent [19]

Hartney

[11] Patent Number: 5,139,925
[45] Date of Patent: Aug. 18, 1992

[54] SURFACE BARRIER SILYLATION OF NOVOLAK FILM WITHOUT PHOTOACTIVE ADDITIVE PATTERNED WITH 193 NM EXCIMER LASER

[75] Inventor: Mark A. Hartney, Carlisle, Mass.

[73] Assignee: Massachusetts Institute of Technology, Cambridge, Mass.

[21] Appl. No.: 423,016

[22] Filed: Oct. 18, 1989

[51] Int. Cl.[5] ............................ G03C 5/00; G03F 7/00
[52] U.S. Cl. .................................. 430/326; 430/309; 430/315; 430/945
[58] Field of Search ............... 430/325, 326, 309, 315, 430/945

[56] References Cited

U.S. PATENT DOCUMENTS

| 4,552,833 | 11/1985 | Ito et al. ............................... 430/325 |
| 4,613,398 | 9/1986 | Chiong et al. ....................... 156/628 |
| 4,614,706 | 9/1986 | Matsuzawa et al. ................ 430/313 |
| 4,657,845 | 4/1987 | Frechet et al. ...................... 430/326 |
| 4,737,425 | 4/1988 | Lin et al. .............................. 430/311 |
| 4,782,008 | 11/1988 | Babich et al. ....................... 430/313 |
| 4,803,181 | 2/1989 | Buchmann et al. ................ 437/228 |
| 4,808,511 | 2/1989 | Holmes ................................ 430/325 |
| 4,810,601 | 3/1989 | Allen et al. ........................... 430/18 |

FOREIGN PATENT DOCUMENTS

| 0184567 | 11/1986 | European Pat. Off. . |
| 0248779 | 9/1987 | European Pat. Off. . |
| 248779 | 9/1987 | European Pat. Off. . |

OTHER PUBLICATIONS

"Chemical Reactions Induced by Soft X-ray and E-beam Exposure of Novolec-Based Resists", Derrick C. Mancini et al.
"An optimized positive resist for electron-beam direct writing: PER-1" Yasuo Lida et al.
"The Mechanism of the Desire Process" B. Roland et al.
"Single Level Dry Developable Resist Systems, Based on Gas Phase Silylation" Schellekens et al.
Visser et al, "Mechanism and Kinetics of Silylation of Resist Layers from the Gas Phase", Proceedings of SPIE, vol. 771 (1987), pp. 1–7.

Primary Examiner—Charles L. Bowers, Jr.
Assistant Examiner—Christopher G. Young
Attorney, Agent, or Firm—Thomas J. Engellenner; Michael I. Falkoff

[57] ABSTRACT

A resist exposed to patterned radiation at 193 nm forms a highly crosslinked barrier layer in the exposed regions of the resist surface. The complementary surface regions are silylated in a silicon-containing reagent, and the exposed regions are readily removed by a oxygen RIE plasma. The laser exposure is a reciprocal process allowing precise control. Pattern definition is enhanced by limiting the exposure and the silylation to the surface of the resist.

3 Claims, 6 Drawing Sheets

SURFACE BARRIER SILYLATION OF NOVOLAK FILM WITHOUT PHOTOACTIVE ADDITIVE PATTERNED WITH 193 NM EXCIMER LASER

The U.S. Government has rights in this invention pursuant to Department of the Air Force Contract No. F19628-85-C-0002.

TECHNICAL FIELD

The Present invention relates to semiconductor patterning and device fabrication, and more particularly to microlithography of the type involving exposure, silylation, and plasma etching, e.g. by oxygen RIE, to selectively remove the non-silylated regions of a resist.

These processes generally start with a single self-planarizing resist layer, which is exposed to a pattern of radiation by direct writing or using an appropriate mask. The exposed layer of resist is then placed in a silylating vapor environment and silicon is incorporated into the resist in either the exposed or the unexposed regions, depending on the process involved.

In one approach, the resist includes, or has additives containing, functional groups which are capable of reacting with the silylating reagent and which are either created or destroyed by illumination, so that silicon which diffuses into the resist is incorporated only into either the illuminated or the unilluminated regions.

In another approach, the resist is formulated with a high concentration of functional groups to which silicon binds, and illumination operates only to control the rate of diffusion of the silylating reagent into the resist. This latter approach has been widely commercialized as the DESIRE process, an acronym for "diffusion enhanced silylating resist".

As a theoretical matter, the rate of diffusion of a particular silylating agent can depend on the composition and degree of crosslinking of the resist, on the presence of certain blocking components in the resist, the presence or creation of porosity in the resist, the mobility and reactivity of the silylating reagent and other factors. For example, one PLASMASK resist employed for the DESIRE processes, utilizes a diazoquinone component to block permeation of the silylating agent, so that only the exposed regions, where diazoquinone is destroyed, absorb and incorporate silicon. The precise mechanism of blocking has been conjectured to rely on thermal crosslinking in the diazoquinone-rich regions, which apparently occurs during the silylating step which is carried out at elevated temperatures. The relatively heavy reagent hexamethyldisilazane (HMDS) is employed as a silylating reagent, and effective differential etch resistance has been attained at various temperatures under differing conditions, and in one process is attained when the silylation is performed in a narrow range of temperatures above 140° C. Thus, the incorporation of silicon may be viewed as a relatively complex end point of a series of possibly competing processes in which light exposure may set certain initial conditions of functionality, porosity and polymer composition, and subsequent heating and silylating drive the processes of diffusion, further crosslinking and chemical attachment or incorporation of silicon.

Various studies have been carried out on commercial novolac resists to elucidate the mechanisms of exposure chemistry. There are some suggestions that the photoactive compound (PAC) added to such resists is the primary factor in effective exposure, and that crosslinking occurs only at rather high temperatures, due in part to reactions with PAC photodecomposition products. For wet processing applications, the exposure chemistry of novolac resists to e-beam and x-ray radiation has also been explored. The varied and sometimes conflicting effects observed in experiments suggest that various factors necessary to the achievement of differential diffusion and the selective incorporation of silicon into regions of the resist are complex and not readily predicted.

Thus, while a general range of possible mechanisms have been discussed, e.g., in U.S. Pat. No. 4,613,398 of Chiong, practical processes appear to have required extensive experimentation and adjustment of many conditions to arrive at one particular set of conditions that result in a sufficient differential rate of silicon incorporation after exposure to achieve a differential etch rate effective to transfer the lithography pattern.

OBJECTS AND SUMMARY OF THE INVENTION

It is an object of the invention to provide an improved resist and method of processing.

It is a further object of the invention to provide a single layer resist and method of selectively silylating and dry-developing the resist to transfer a positive pattern to a substrate.

These and other desirable features are obtained according to the present invention by forming by exposure to a non-damaging fluence of far ultraviolet radiation a crosslinked mask at the surface of a thin film. A resist is exposed to patterned radiation such that the resist absorbs substantially all radiation at the exposure wavelength in a surface depth under a few thousand Angstroms, and crosslinks to a significant level upon exposure, and such that the uncrosslinked regions retain a permeability and a functionality for receiving silicon from a silylating agent, while portions of the film at and below the crosslinked regions remain substantially free of silicon.

The resist is spun as a single layer onto a wafer and is exposed to 193 nm far ultraviolet radiation, resulting in a pattern of highly crosslinked illuminated regions localized at the surface of the film. The exposed wafer is preferably silylated by placing it in an environment of a relatively light and reactive reagent such as a methylated silylamine at relatively low temperatures, resulting in selective incorporation of silicon at the surface in the uncrosslinked regions. Development is effected by passing the silylated coated wafer though an oxygen RIE plasma which is controlled to provide a substantially vertical etching profile. Since crosslinking is localized at the surface, the exposed regions of resist etch cleanly. Moreover, silylation may be limited to a surface region, so that neither scattered radiation nor diffusion of silicon occur at a depth. This allows sharp etch profiles to be achieved by simply controlling the etch parameters.

Strict reciprocity was observed with exposure energies of as low as five to fifty mJ/cm$^2$ for various resist formulations, and no photoactive compound was necessary in the resist. Steep feature profiles were obtained with 0.3 micron patterns in 1.5 $\mu$ thick resist, and relatively low temperature, fast cycle silylation was achieved exhibiting a process stability characteristic of a single controlling reaction parameter.

Brief Description of the Drawings

These and other features of the invention will be understood by reference to the following Figures illustrating representative embodiments and results according to the teachings of applicant's invention, taken together with the description thereof, wherein.

DETAILED DESCRIPTION

Figure 1A:
FIG. 1 illustrates the steps of one microlithography process according to the present invention.
Figure 1B:
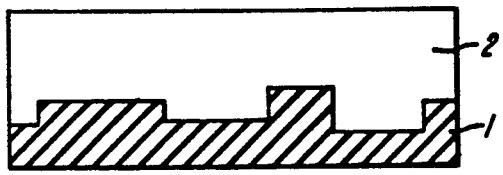
Figure 1C:
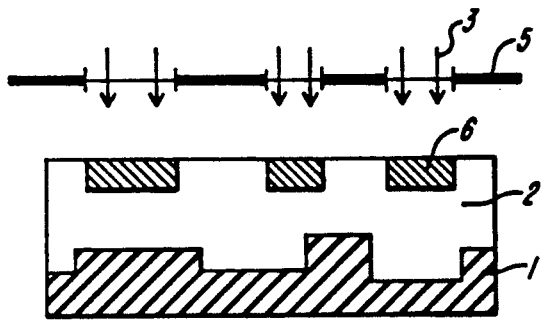
Figure 1D:
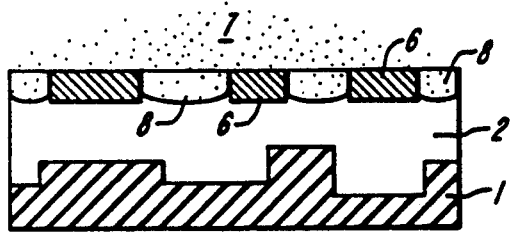
Figure 1E:
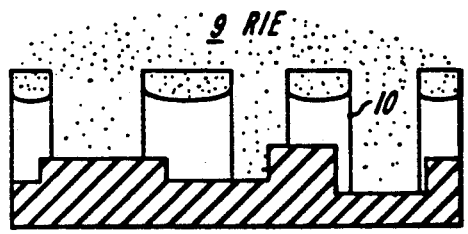

An exemplary process according to applicant's invention is illustrated in FIG. 1, with different stages shown in schematic sections A–E of a wafer or other substrate at different processing steps. As shown at (A), a wafer 1 has surface topography features 1a protruding as a result of earlier material growth, deposition or removal steps. A resist layer 2 is deposited at stage (B), which in the discussion below may be a novolac resist, with or without a photoactive component (PAC), and preferably having a thickness of about 1–1.5 microns. Resist layer 2 has sufficient depth to cover the surface topography, but is thin enough to permit the patterning of submicron-scale features. The resist 2 is baked to stabilize the layer and drive off solvent.

At stage (C), the coated wafer 1,2 is exposed to patterned high energy radiation 3 by optical projection through a mask 5, which may, for example, be defined by an aluminum pattern on a quartz plate. According to a principal aspect of the present invention, the radiation is of a wavelength which is substantially entirely absorbed in the upper surface region of resist layer 2, and is applied in a total dose which crosslinks the exposed surface region 6 to a degree effective to prevent subsequent silylation thereof. The fluence is maintained sufficiently low to prevent destructive scission or thermal effects.

At stage (D), the exposed wafer is placed in a silylating environment such that a silylating reagent 7 penetrates and is incorporated into those regions 8 of the resist which were not exposed to radiation, but does not diffuse into or below the crosslinked regions 6. Specifically, reagent 7 penetrates all or partway through film 2 in those areas between the crosslinked regions 6, but the exposed regions 6 serve as a mask preventing diffusion of or attachment of silicon.

At stage (E), the silylated wafer is placed in an oxygen reactive ion etching plasma 9 which etches through the unsilylated crosslinked regions 6 as well as the underlying resist. Strict verticality of the etched walls 10 is achieved by appropriate adjustment of the etch parameters.

Several advantages of exposure and processing according to the present invention can be understood as follows. First, by exposing at a short wavelength which is substantially entirely absorbed at the resist surface, extraneous exposure due to scattering is localized, and uncontrolled reflection from the wafer surface is eliminated. Second, by exposing at relatively low fluences, complicating factors due to thermal effects and scission products are reduced. Third, by employing relatively light or unhindered silylation reagents, lower temperatures and processing times may be used for silylation, further reducing these complicating factors.

Different aspects of the invention and its range of application will be understood from the following example of resist patterning in accordance with the process of FIG. 1.

The net result of the process is a positive resist pattern with a sharply defined silicon etch barrier, and an exposed region which is, except for a shallow skin, essentially unhardened. The exposed regions are readily etched with a high degree of control by plasma etching.

EXAMPLE 1

A coating of FSC-L was spun onto a substrate to form a film approximately one micron thick, and was subjected to a soft prebake at 90° C. for ninety seconds on a hot plate. Two regimens of exposure were carried out, each providing a total dose of 60 mJ/cm$^2$ at 193 nm. In the first case, the dose consisted of twenty-four 2.5 mJ pulses; in the second case the dose was delivered as one hundred twenty 0.5 mJ/cm$^2$ pulses. In each case silylation was then effected by exposing the film to an atmosphere of dimethylsilyl dimethylamine (DMSDMA) at 12 Torr for one minute at 100° C. The silylated substrates were then placed in an oxygen RIE plasma at 20 mTorr and a bias of $-200$ V for approximately 40 minutes, to clear the unsilylated portions of the resist. Line features of half micron width were formed with sharp profiles in each case.

The resist coating FSC-L is a pure novolac resin, i.e., a cresol-formaldehyde copolymer compounded without a PAC, manufactured by Shipley for use as a protective surface coating, rather than as a photoresist. A surprisingly high and unexpected crosslinking effect was observed when the coating was illuminated at the 193 nm wavelenqth of an Argon Fluoride excimer laser, and this crosslinking was effective to provide a silylation barrier for the described process. The novolac cresol-formaldehyde copolymer was highly absorbent at this wavelength, and effects due to scattering and reflection were negligible.

EXAMPLE 2

A coating of MacDermid PR1024 was spun onto a substrate to form a film approximately one micron thick, and was subjected to a prebake as described above. Two regimens of exposure were carried out, each at a fluence of 2.5 mJ/cm$^2$-pulse. Total dosage of 50 and of 40 mJ/cm$^2$ were delivered. The 50 mJ/cm$^2$ exposure was treated with DMSDMA at 90° C. for one minute at 12 Torr. The resist exposed at 40 mJ/cm$^2$ was silylated with DMSDMA at 80° C. for five minutes at a pressure of 10 Torr. Etching was performed as in Example 1. A regular array of 0.4 micron wide lines was formed with clear resolution.

EXAMPLE 3

A resist material (SAL 601 of Shipley) which is compounded for electron beam lithography was coated on a substrate to a depth of approximately one micron. The material was a novolac based resist which contained an organohalide compound as an acid-generating species, and also contained an acid-catalyzed crosslinking agent. After curing, the resist was exposed at a fluence of 2.5 mJ/cm$^2$-pulse to a total dose of 10 mJ/cm$^2$ of 193 nm radiation. Silylation of the exposed wafer was carried out in trimethylsilyldimethylamine (TMSDMA) for one minute at 140° C. and a pressure 30 Torr. Removal of unsilylated material was achieved in an RIE under approximately the same conditions as in the above two examples. Excellent contrast and submicron feature definition were obtained.

Using the same exposure regimen, the resist was silylated with DMSDMA for one minute at 100° C. and a pressure of 10 Torr. In this case, etching was performed with a two-step process. Prior to an oxygen RIE plasma, the sample was etched for two minutes in a mixture of 80% oxygen, 20% $CF_4$ with a bias of $-100V$. The reactive fluorocarbon pre-etch resulted in a clearer final product, with less residue, e.g., grass, in the exposed areas. In this, and certain other experiments, the presence of grass was occasionally noted, particularly in samples which had been stored after silylation and before etching. A dilute hydrofluoric acid liquid post-etch was also found effective to clear up this problem.

EXAMPLE 4

Figure 2:
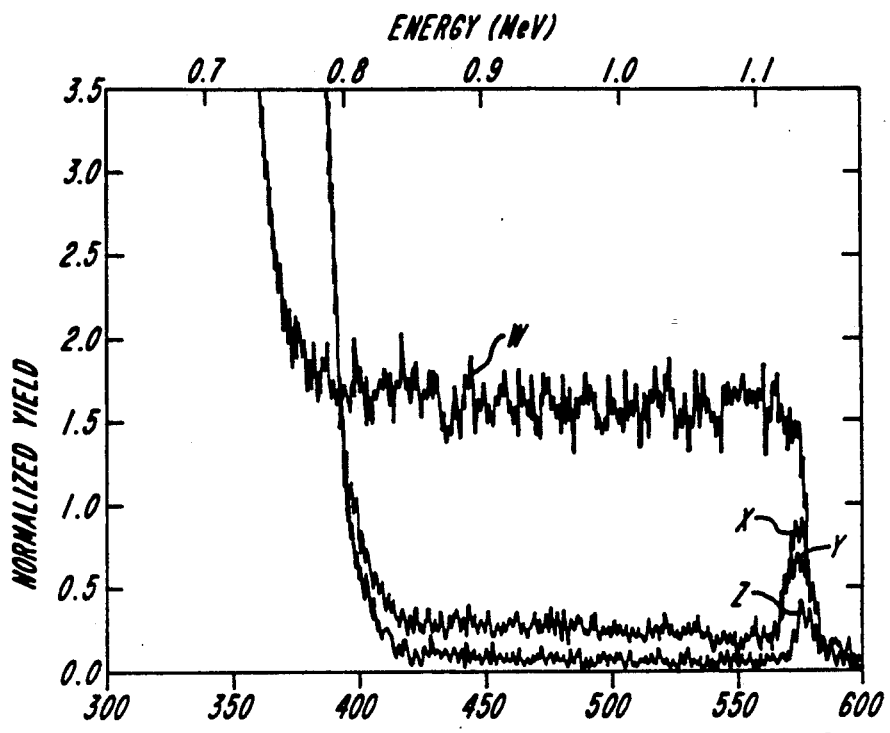
FIG. 2 shows measurements of the silicon depth profile of resists exposed and silyated as in FIG. 1(D)

Using the resist coating of Example 3, a set of four specimens were prepared to assess the degree of crosslinking attained in the exposure step. FIG. 2 shows the Rutherford Backscattering Spectra (RBS) of the four specimens, with exposure doses of 0, 5, 10 and 30 $mJ/cm^2$ shown respectively by the curves labelled W, X, Y and Z. These curves reveal excellent selectivity between exposed and unexposed portions of the resist, and indicate that full saturation is attained at or below the 10 $mJ/cm^2$ exposure level.

EXAMPLE 5

Figure 3A:
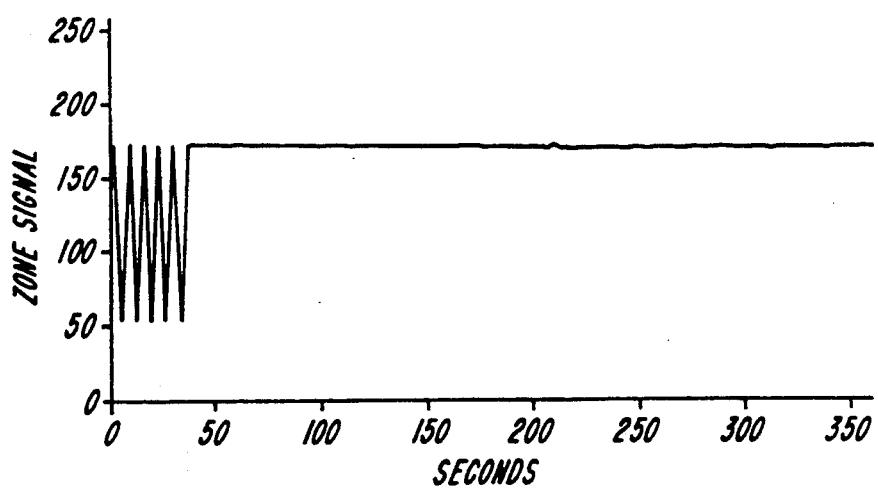
FIGS. 3A, 3B illustrate liquid dissolution rates in treated and untreated regions.
Figure 3B:
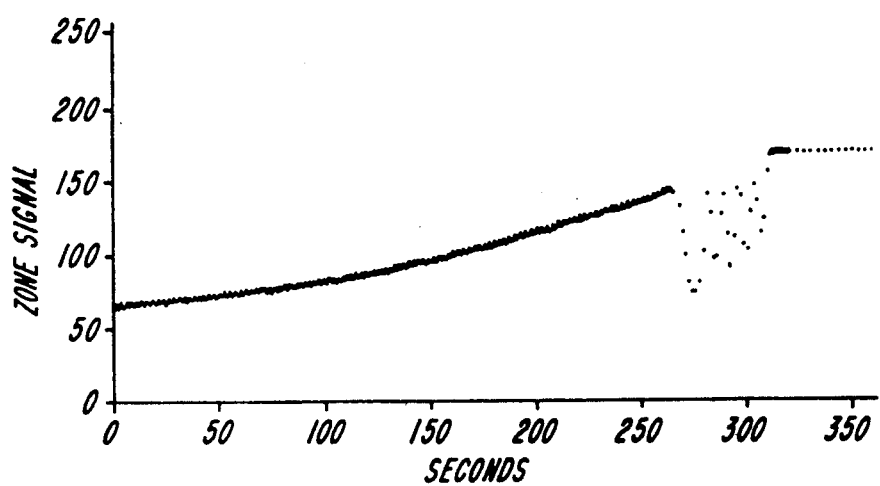

Using the resist coating of Example 2, a pair of specimens were produced and the resist thickness was monitored by an interferometric technique during dissolution to determine the thickness of the exposed layer. FIG. 3A shows the interferogram for an unexposed region of resist. The etch proceeds at an apparently uniform rate, clearing five half wavelengths in under forty seconds, entirely removing the resist. FIG. 3B shows a corresponding curve for a region of the resist exposed at 150 $mJ/cm^2$ Over the course of 250 seconds, the etch reveals no peaks, indicating a negligible material removal rate, totalling under a half wavelength. Thereafter, all material is removed at the same rate as for the unexposed portion shown in the initial portion of the curve of FIG. 3A, clearing the full thickness in approximately forty seconds. This indicates that substantially all crosslinking occurs in a thin region localized at the top of the resist, and that the portion of resist below the top layer is essentially unaffected by exposure. The substantially unlinked condition of the bulk of the resist accounts for the excellent contrast and ease of clearing of the resist below the exposed portions.

EXAMPLE 6

A series of exposures followed by silylation and etching were carried out to determine the efficacy of 193 nm surface crosslinking for pattern formation in different resists. Table 1 sets forth a number of representative process conditions, giving the laser fluence per pulse of the 193 nm Argon Fluoride excimer laser used for exposure, the total dose, the reagent used for silylation and the silylation conditions.

TABLE 1

| Resist | Fluence (mJ/cm² pulse) | Dose (mJ/cm²) | Si Reagent | Temp (C.) | Time | Pressure (Torr) |
|---|---|---|---|---|---|---|
| FSC-L | 2.5 | 100 | DMSDMA | 22 | 5 min | 100 |
| 150-g | 2.5 | 100 | HMDS | 140 | 1 min | 70 |
| 150-g | 2.5 | 250 | HMDS | 160 | 2 min | 30 |
| FSC-L | 2.5 | 20 | DMSDMA | 100 | 10 sec | 10 |

Comparing the first and last entries, it is noteworthy that, with the same fluence and silyating reagent, stronger silylating conditions require a greater laser exposure dose to achieve an appropriate level of contrast In particular, with silylation of 10 seconds at 10 Torr, a relatively low dose of 20 $mJ/cm^2$ was effective, whereas under stronger silylation conditions of 5 minutes at 100 Torr, comparable selectivity was achieved only with the greater 100 $mJ/cm^2$ exposure. The silylation temperature was substantially lowered to achieve suitable stability in the latter process. Similarly, with 150-g, a range of conditions were found suitable, with stronger silylation conditions requiring increased exposure (from 100 to 250 $mJ/cm^2$).

In general, the appropriate exposure levels varied among the resists, with the acid catalyzed special resists requiring the lower exposures, between 5 and 20 $mJ/cm^2$. Typical exposure levels for the FSC materials and the PR1024 were 30 to 75 $mJ/cm^2$, and 50 to 150 $mJ/cm^2$, respectively. For Plasmask and for 1400 series resists a 100 $mJ/cm^2$ dose was typical. A significant feature of these exposures was that using the 193 nm radiation to effect crosslinking at the surface, the exposures were found to be highly reciprocal so long as the fluence was maintained substantially below the ablation threshold for the resist.

As regards the silylation conditions, DMSDMA proved the most versatile, with typical times of 1 to 3 minutes at 100° C. This reagent also proved effective at quite low temperatures (25° C.) at longer times. For TMSDMA, a 1 to 3 minute silylation at 140° C. was typical, and for hexamethyldisilazane (HMDS) 5 minutes at 160° C. was typical. As noted above, for milder silylation conditions, lower levels of exposure were found effective.

Once it was discovered that levels of cross-linking which blocked silylation could be achieved by such exposure in a range of resists, including novolac coatings without any photoactive additives, the following general methodology was developed to achieve an effective pattern by silylation and dry etching techniques. First, a given resist was placed in a silylating atmosphere and a range of conditions were tried to determine the optimum parameters necessary to achieve an effective barrier against plasma etching. Next prior to silylating at the optimum silylating parameters, a series of laser exposures at different doses were made on a set of coated substrates. This series served to determine the minimal exposure which produced a level of crosslinking effective to block silylation in the exposed areas. A suitable set of steps for positive silylation resist patterning was then selected to be an exposure level not substantially above the minimal blocking exposure, followed by silylation at the optimum silylating parameters.

This methodology was found to provide effective exposure regimens for positive silylation resist patterning in a broad range of resists, including resists which had been generally used as negative silylation resists in earlier liquid etch processes. Patterned resists were also exposed using 215 nm ultraviolet light from a Deuterium lamp, with similar results, confirming the suitability of a highly absorbed, very short wavelength exposure source for this method. The resist absorbance at these wavelenghts was estimated to be two to ten times greater that the absorbance of resists at the 248 nm wavelength previously employed in some silylation processes.

Figure 4:
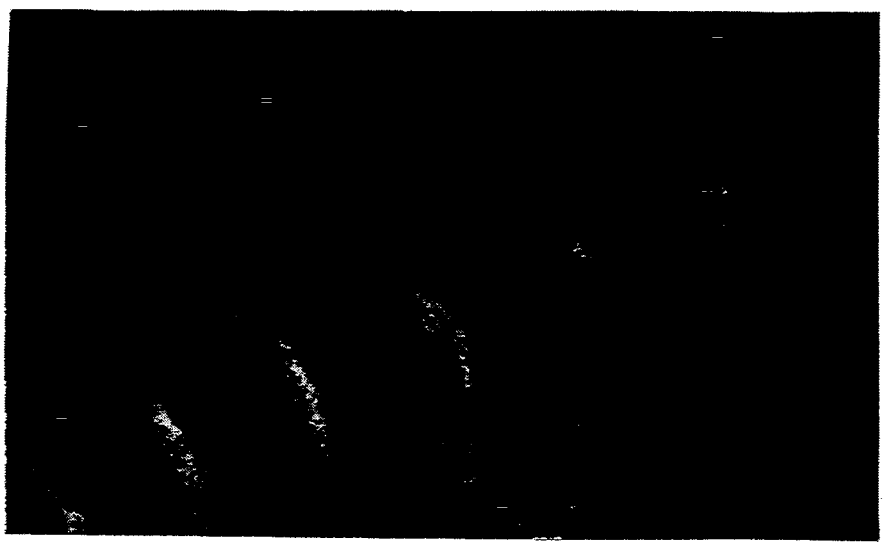
FIGS. 4–6 are photographs of representative etched resist patterns.
Figure 5:
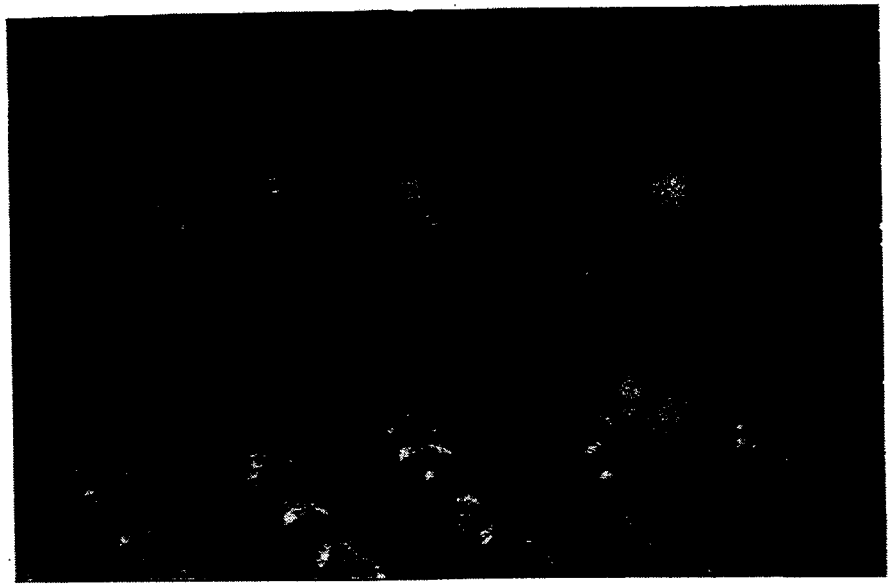
Figure 6:
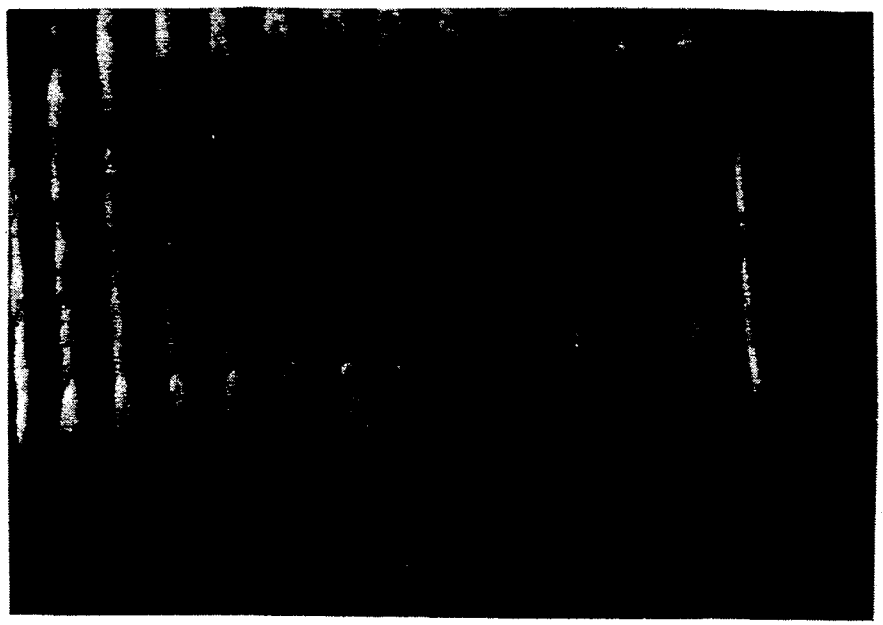

FIGS. 4 through 6 show scanning electron micrographs of resists exposed and etched according to the present invention. FIG. 4 shows a pattern of 0.3 micron features formed as in the first set of conditions described in Example 1. This particular specimen was "prebaked" prior to the actual silylation, for ten minutes on a 100° C. stage in the silylation chamber. Prebake times of two minutes were more commonly used for other samples.

FIG. 5 shows a regular pattern of 0.5 micron lines, spaces and ninety-degree elbows formed in a resist under the second set of exposure conditions described in Example 1 above.

FIG. 6 shows a pattern of 0.4 micron lines and spaces formed in a resist under the first set of conditions described in Example 2 above.

In each case, very clear patterns having steep walls and a high aspect ratio were achieved.

The foregoing examples all deal with films which are formed by spin-coating, but the invention contemplates other methods of applying a resist film. In particular, the film may be dry-deposited on the substrate as a polymer resist film formed from a suitable precursor, such as phenol, in a plasma chamber. In the deposition process, other species may be provided to assure suitable functionalities for crosslinking upon exposure. Basic plasma-deposited phenol-derived polymers have been found to silylate readily to a sufficient extent for lithography.

This completes a description of selective silylation by photoinduced crosslinking processes of the invention, which have been described with respect to illustrative embodiments in a range of materials. The invention being thus described, variations and modifications will occur to those skilled in the art, and such variations and modifications are considered to be within the scope of the invention, as defined as the claims appended hereto.

What is claimed is:

1. A method of selectively silylating a film to form an etch barrier, such method comprising the steps of exposing a novolac film without photoactive additives to a patterned dose of 193 nm excimer laser ultraviolet radiation in an amount effective to crosslink the film only at its surface in exposed regions, and after exposure placing said film surface in a silylating reagent under conditions to selectively silylate surface regions of the film complementary to the exposed regions, said excimer laser being controlled to provide a fluence below the ablation threshold of the film and a total dose effective to crosslink only an outer surface portion in said exposed regions without introducing thermal effects, whereby the resist functions as a positive silylation resist of high contrast and resolution when silylated under a minimal set of silylation conditions.

2. The method of claim 1, further comprising the step of etching the exposed silylated resist film in an oxygen RIE plasma etch.

3. The method of claim 2, further comprising the step of providing a halogen-containing pre- or post- etch.

* * * * *